United States Patent
Hashimoto

(10) Patent No.: US 7,411,256 B2
(45) Date of Patent: Aug. 12, 2008

(54) SEMICONDUCTOR INTEGRATED CIRCUIT DEVICE CAPACITIVE NODE INTERCONNECT

(75) Inventor: Shingo Hashimoto, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 145 days.

(21) Appl. No.: 10/998,846

(22) Filed: Nov. 30, 2004

(65) Prior Publication Data
US 2005/0127419 A1 Jun. 16, 2005

(30) Foreign Application Priority Data
Dec. 16, 2003 (JP) ............... 2003-417580

(51) Int. Cl.
*H01L 29/76* (2006.01)
*H01L 29/94* (2006.01)
(52) U.S. Cl. ............... 257/393; 257/301; 257/303; 257/903
(58) Field of Classification Search .......... 257/66, 257/67, 69, 903, 904, 301–305, 393, E27.098, 257/E27.099
See application file for complete search history.

(56) References Cited

U.S. PATENT DOCUMENTS

| 6,271,569 B1 * | 8/2001 | Ishigaki et al. ............... 257/381 |
| 2003/0053351 A1 * | 3/2003 | Oh et al. .................. 365/200 |
| 2003/0142538 A1 * | 7/2003 | Ohbayashi et al. .......... 365/154 |

FOREIGN PATENT DOCUMENTS

| CN | 1204871 A | 1/1999 |
| CN | 1435888 A | 8/2003 |
| JP | 09-017965 | 1/1997 |
| JP | 10-163440 | 6/1998 |
| JP | 2002-324855 | 11/2002 |

OTHER PUBLICATIONS

Chinese Office Action dated Sep. 1, 2006 with an English translation.

* cited by examiner

*Primary Examiner*—Hung Vu
(74) *Attorney, Agent, or Firm*—McGinn IP Law Group, PLLC

(57) ABSTRACT

A semiconductor integrated circuit device is provided, which involves inhibiting a pattern change in the node interconnect and an increase of number of manufacturing process, when the capacitor is additionally installed in the SRAM, while providing higher reliability in the node interconnect. There is provided a semiconductor integrated circuit device, comprising: a node interconnect (lower capacitance electrode), being embedded in a trench formed in an interlayer insulating film provided on a semiconductor substrate, a surface of said lower capacitance electrode being formed to be substantially coplanar to a surface of the interlayer insulating film; and a capacitor, including: a capacitance insulating film, being flatly formed on a surface of the interlayer insulating film; and an upper capacitance electrode, being flatly formed thereon. Since the surface of the node interconnect is flat, forming thinner films of the capacitance insulating film and the upper capacitance electrode can be achieved, and the reliability of the capacitor is improved, and the planarization of the upper layer interconnects can be planarized to provide a miniaturization thereof.

20 Claims, 10 Drawing Sheets

SEMICONDUCTOR INTEGRATED CIRCUIT DEVICE CAPACITIVE NODE INTERCONNECT

This application is based on Japanese Patent Application NO.2003-417580, the content of which is incorporated hereinto by reference.

BACKGROUND OF THE INVENTION

1. Field of the Invention

The present invention relates to a semiconductor integrated circuit device comprising a capacitor as a capacitive element in an interconnect structure, and more particularly relates to a semiconductor integrated circuit device, which is preferably applied to a static random access memory (SRAM) comprising a capacitor.

2. Related Art

In modern semiconductor integrated circuit devices, efforts for reducing the supply voltage to about 1.0 to 2.1 volts are conducted, and in order to meet the needs, a miniaturization of the device size and the interconnect line width for various devices is developed. For example, in the case of SRAM, a scale reduction of the memory cell and a scale reduction of the interconnect line width coupled thereto is developed. While the scale reduction of the interconnect line width and the memory cell provides a decrease of resistivity of the interconnect that provide a coupling between various elements, and thus is effective in view of achieving high-speed operation, an interconnect capacitance is adversely increased, and thus a disadvantage on element characteristics may be generated. For example, in a SRAM cell consisting of six MOS transistors $Q1$ to $Q6$ shown in FIG. 10, accumulation of data is conducted by utilizing capacitance which is parasitic on interconnects $N1$ and $N2$ (hereinafter, the type of interconnects such as the interconnects $N1$ and $N2$ are referred to as "node interconnects", and the node interconnect means an interconnect, being coupled to a node, to which respective drains of the load transistor $Q1$ and the driving transistor $Q3$ are coupled, and an interconnect, being coupled to a node, to which respective drains of the load transistor $Q2$ and the driving transistor $Q4$ are coupled), which cross-couples a gate and a drain of a pair of driving transistors $Q3$ and $Q4$ that reciprocally turn on and off. (hereinafter referred to as "node capacitance") However, a size of a diffusion layer for forming a node capacitance is decreased as the memory cell size and the line width size (gate area) are reduced, and, in turn, the node capacitance is decreased, and thus a problem of a soft-error is occurred. The soft-error is a phenomenon, in which, when a ray and neutron beam are irradiated on the memory cell, data electric charge accumulated in the node capacitance escapes away toward the semiconductor substrate side and thereby dissipating the data.

To address the soft-error problem, Japanese Patent Laid-Open No. H10-163,440 (1998) discloses a technology of forming a multi-layered structure by laminating respective node interconnects (node interconnects $N1$ and $N2$ in the example shown in FIG. 10) of a pair of driving transistors that compose a memory cell, partially containing an insulating layer therebetween, and a capacitor is composed of the multi-layered structure, and a capacitance, which is parasitic on the node interconnect by this capacitor, or in other words a node capacitance, is increased. Since the accumulated data electric charge is increased by the increase of the node capacitance, a SRAM having higher soft-error resistance can be obtained without increasing the size of the memory.

In addition, in order to increase the node capacitance of the memory cell, Japanese Patent Laid-Open No. 2002-324,855 proposes a technology of: forming a node interconnect by forming a trench in an insulating film formed on the semiconductor substrate and filling the trench with an electrically conducting film; and forming a first electrode having a plug shape partially in this node interconnect, and after exposing the upper end portion of the first electrode for over a predetermined height thereof, consecutively forming the capacitance insulating film and the second electrode to cover the exposed portion. In the disclosure of Japanese Patent Laid-Open No. 2002-324,855, since the capacitor is composed by utilizing the upper surface and the side surfaces of the first electrode, the area thereof facing to the second electrode can be increased, thereby providing an advantageous effect in view of increasing the node capacitance. In addition, since the capacitance insulating film and the second electrode are flat on the first electrode, the capacitance insulating film composing the capacitor can be formed to a uniform film thickness, thereby improving the reliability of the capacitor.

However, since the respective node interconnects of pair of the driving transistors are required to be formed as layered structures in the aforementioned technology disclosed in Japanese Patent Laid-Open No. H10-163,440, the node interconnects must be formed to be dual layers. Therefore, as compared with the former SRAM, in which both node interconnects are formed in one layer, the pattern of the node interconnect should be changed, and an additional process step for manufacturing a contact for electrically coupling the node interconnect formed in the upper layer side to the transistor is required, thereby adversely increasing the process steps. Further, since the capacitor is composed only in a crossing region of both node interconnects, it is difficult to take larger areas of facing electrodes, and thus, there is a limitation in increasing the node capacitance.

In addition, since the technology disclosed in Japanese Patent Laid-Open No. 2002-324,855 involves forming both node electrodes of pair of driving transistors in the same layer, the node capacitance can be increased without changing the pattern of the node interconnect in the SRAM. However, even though the capacitance insulating film and the second electrode are flatly formed on the upper surface of the first electrode in the formed capacitor, unwanted step portions may be generated in the capacitance insulating film and the second electrode along the side surfaces and their circumferences of the first electrode, since the upper end portion of the first electrode is exposed over a predetermined height in order to increase the node capacitance. Therefore, when the sizes of the memory cell and the line widths of the node interconnect are reduced, and concurrently the film thicknesses of the capacitance insulating film and the node interconnect are reduced, defects in the steps are easily occurred in the capacitance insulating film and the second electrode in the above-described step portion, thereby causing a decrease of the manufacturing yield for the memory cell and a decrease of the reliability thereof.

SUMMARY OF THE INVENTION

In view of the above situation, the present invention presents a solution to the above-mentioned problems, and the present invention provides a semiconductor integrated circuit device, which involves inhibiting a pattern change in the node interconnect, to which the capacitor is coupled, and inhibiting an increase of number of manufacturing process, when the capacitor is additionally provided in the SRAM, while providing higher reliability in the node interconnect.

According to the present invention, there is provided a semiconductor integrated circuit device, comprising: a semiconductor substrate; and a capacitor including a multi-layer structure comprising: a lower capacitance electrode; a capacitance insulating film; and an upper capacitance electrode, all of which are deposited in this turn, the capacitor being disposed on the semiconductor substrate, wherein the lower capacitance electrode is embedded in a trench formed in an interlayer dielectric layer provided on the semiconductor substrate, and an upper surface thereof is formed to be substantially coplanar to an upper surface of the interlayer dielectric layer, wherein the capacitance insulating film is substantially flatly formed so as to contact the upper surface of the interlayer dielectric layer containing the lower capacitance electrode, and wherein the upper capacitance electrode is substantially flatly formed so as to contact an upper surface of the capacitance insulating film.

According to the present invention, there is provided a semiconductor integrated circuit device, comprising: a lower capacitance electrode, being embedded in a trench formed in an interlayer dielectric layer provided on a semiconductor substrate, a surface of the lower capacitance electrode being formed to be substantially coplanar to a surface of the interlayer dielectric layer; and a capacitor, including: a capacitance insulating film, being flatly formed on a surface of the interlayer dielectric layer containing the lower capacitance electrode; and an upper capacitance electrode, being flatly formed on the capacitance insulating film. In these configurations, the lower capacitance electrode may be composed of at least a part of an interconnect coupled to a circuit element formed on the underlying layer of the interlayer dielectric layer, and has a structure of additionally having an electrostatic capacity of the capacitor to the interconnect of the circuit element.

According to the present invention, the lower capacitance electrode of the capacitor of the semiconductor integrated circuit device is configured as an embedded interconnect formed in the lower interlayer dielectric layer. In addition, the upper surface of the lower capacitance electrode is substantially flatly formed so as to be substantially coplanar to the upper surface of the interlayer dielectric layer. Therefore, the semi conductor integrated circuit device having improved reliability in the node interconnect can be provided without changing the pattern of the node interconnect of the SRAM and adversely increasing the number of the manufacturing process steps, while inhibiting the generation of defects in the step portion even if the film thickness of the capacitance insulating film and the upper capacitance electrode is reduced.

According to the present invention, there is provided with a semiconductor integrated circuit device, comprising: a semiconductor substrate; and a capacitor including a multi-layer structure comprising: a lower capacitance electrode; a capacitance insulating film; and an upper capacitance electrode, all of which are deposited in this turn, the capacitor being disposed on the semiconductor substrate, wherein the lower capacitance electrode is embedded in a trench formed in an interlayer dielectric layer provided on the semiconductor substrate, and the lower capacitance electrode has a same thickness that the interlayer dielectric layer has.

According to the present invention, the lower capacitance electrode has a same thickness that the interlayer dielectric layer has. Therefore, the semiconductor integrated circuit device having improved reliability in the node interconnect can be provided without changing the pattern of the node interconnect of the SRAM and adversely increasing the number of the manufacturing process steps, since a capacitance insulating film, which is provided on the interlayer dielectric layer and the lower capacitance electrode, is formed to be substantially coplanar, and an upper capacitance electrode, which is provided on the capacitance insulating film, is formed to be substantially coplanar.

According to the present invention, since the lower capacitance electrode of the capacitor of the semiconductor integrated circuit device is configured as an embedded interconnect formed in the lower interlayer dielectric layer, and further the surface of the lower capacitance electrode is flatly formed so as to be coplanar to the surface of the interlayer dielectric layer, the capacitance insulating film and the upper capacitance electrode formed thereon can be flatly formed. Therefore, the capacitor having improved reliability can be obtained without causing problems such as generating defects in the step portion and the like when thinner film thickness of the capacitance insulating film and the upper capacitance electrode is formed, and further reduction of the film thickness of the capacitance insulating film can be achieved, thereby providing an advantageous effect in increasing the capacitance. Further, there is almost no influence on a flatness of the surface of the interlayer dielectric layer formed on the capacitance insulating film and the upper capacitance electrode as an upper layer thereof, due to forming thinner capacitance insulating film and thinner upper capacitance electrode, and further, the flatness of the upper layer interconnect layer formed thereon is ensured, thereby allowing the formation of the upper layer interconnect layer with improved reliability.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposed.

In the present invention, a circuit element is a transistor composing a memory cell of a SRAM, and a lower capacitance electrode is preferably composed of an interconnect of the memory cell. In particular, the SRAM comprises at least a pair of driving transistors, which provide a cross-coupling of a gate and a source through a pair of node interconnects, and a capacitor is composed as a pair of capacitors coupled to respective node interconnects, and a lower capacitance electrode of each of the capacitors is preferably composed of the node interconnect.

The SRAM according to the present invention is preferably composed of a SRAM of six transistor-configuration, which comprises a pair of driving transistors, a pair of transfer transistors that are disposed respectively between pair of the node interconnects and a pair of digit lines to couple thereof, and a pair of load transistors that are respectively coupled to pair of the driving transistors.

In addition, the upper capacitance electrode according to the present invention is formed within a region that covers the node interconnect of the SRAM, and in particular, the upper capacitance electrode is preferably formed across the entire region in the memory cell except the region for providing an electric coupling to the upper layer interconnect. In this case, it is preferable that the upper capacitance electrode of the capacitor is fixed at a ground potential, or the upper capacitance electrodes of a pair of capacitors are mutually coupled to have a floating potential. In addition, the upper layer interconnect is a digit line, for example.

In addition, the SRAM according to the present invention may preferably have a configuration, in which at least one memory cell and a well contact cell for providing an electrical coupling of the memory cell to a power line and a ground line of the upper layer are arranged, and wherein the upper capacitance electrode is extended into a partial region of the well contact cell to be electrically coupled to the power line or the ground line in the partial region.

The embodiments according to the present invention will be described in reference to the annexed figures as follows. In all figures, similar numeral is assigned to a similar element, and the description thereof is not presented.

Figure 1:
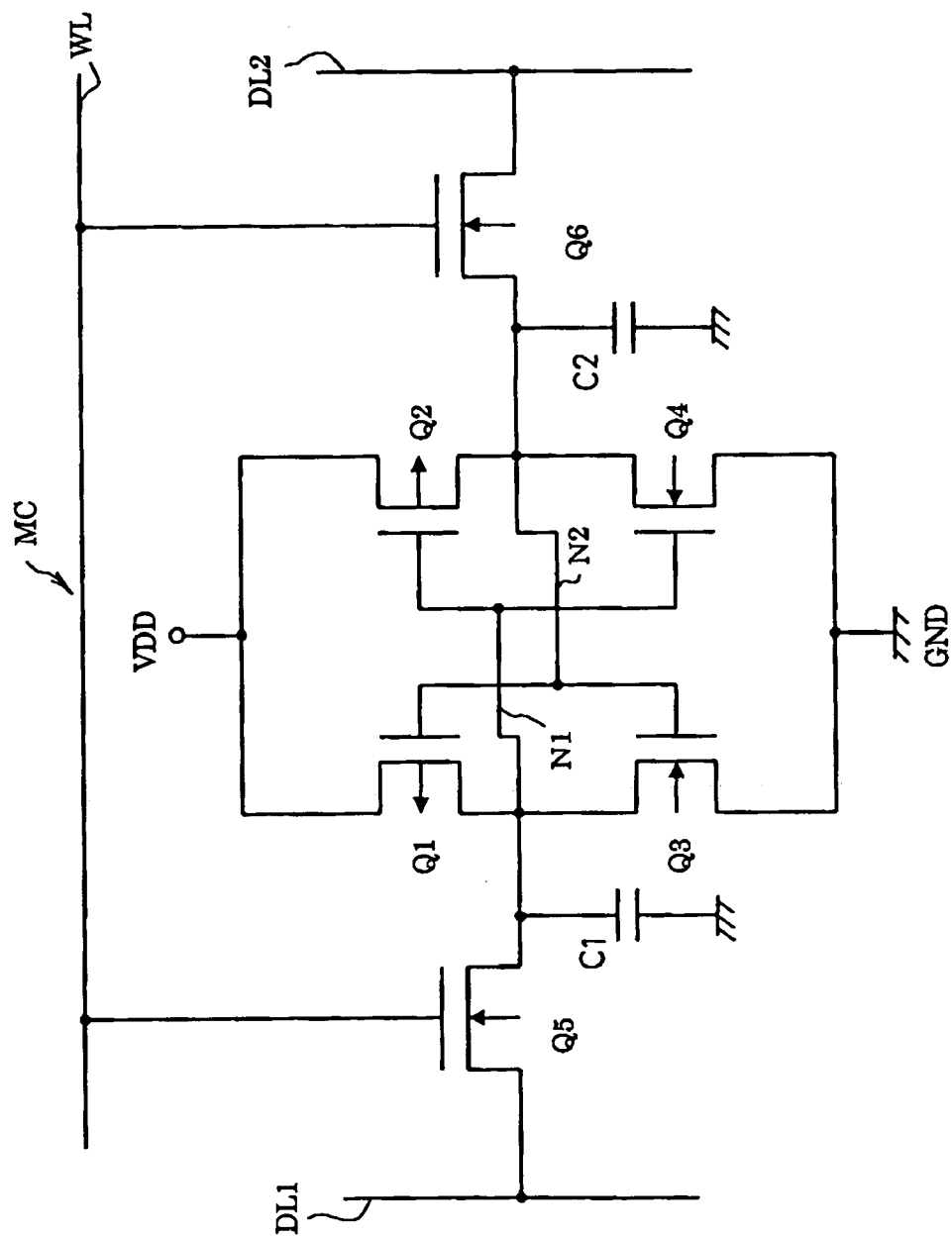
FIG. 1 is an equivalent circuit schematic of a SRAM according to the embodiment.

Semiconductor integrated circuit devices according to the present embodiment will be described in reference to the annexed figures. FIG. 1 is an equivalent circuit schematic of the present embodiment, in which the semiconductor integrated circuit device of the present invention is applied to a SRAM that is composed of six MOS transistors Q1 to Q6. As shown in FIG. 1, two digit lines DL1 and DL2 are crossed for one word line WL, and a memory cell MC is composed in the crossing region. The memory cell MC is composed of load transistors Q1 and Q2 consisting of P-channel MOS transistors, driving transistors Q3 and Q4 consisting of N-channel MOS transistors, and transfer transistors Q5 and Q6 consisting of N-channel MOS transistors for transferring data to digit lines DL1 and DL2. Sources of the load transistors Q1 and Q2 are coupled to an electric power VDD, drains thereof are coupled to drains of the driving transistors Q3 and Q4, and gates thereof are coupled to gates of the driving transistors Q3 and Q4. Sources of the driving transistors Q3 and Q4 are coupled to a grounding GND. The drains of the driving transistors Q3 and Q4 are coupled to gates of the facing driving transistors Q4 and Q3 through node interconnects N1 and N2, respectively. In addition, a drain of the respective driving transistors Q3 and Q4 are coupled to digit lines DL1 and DL2 through the transfer transistors Q5 and Q6, respectively. Each of the gates of the transfer transistors Q5 and Q6 is coupled to a word line WL. Further, the node interconnects N1 and N2 are coupled to capacitors C1 and C2 that are composed between grounding GND and the node interconnect N1 and N2.

Figure 2:
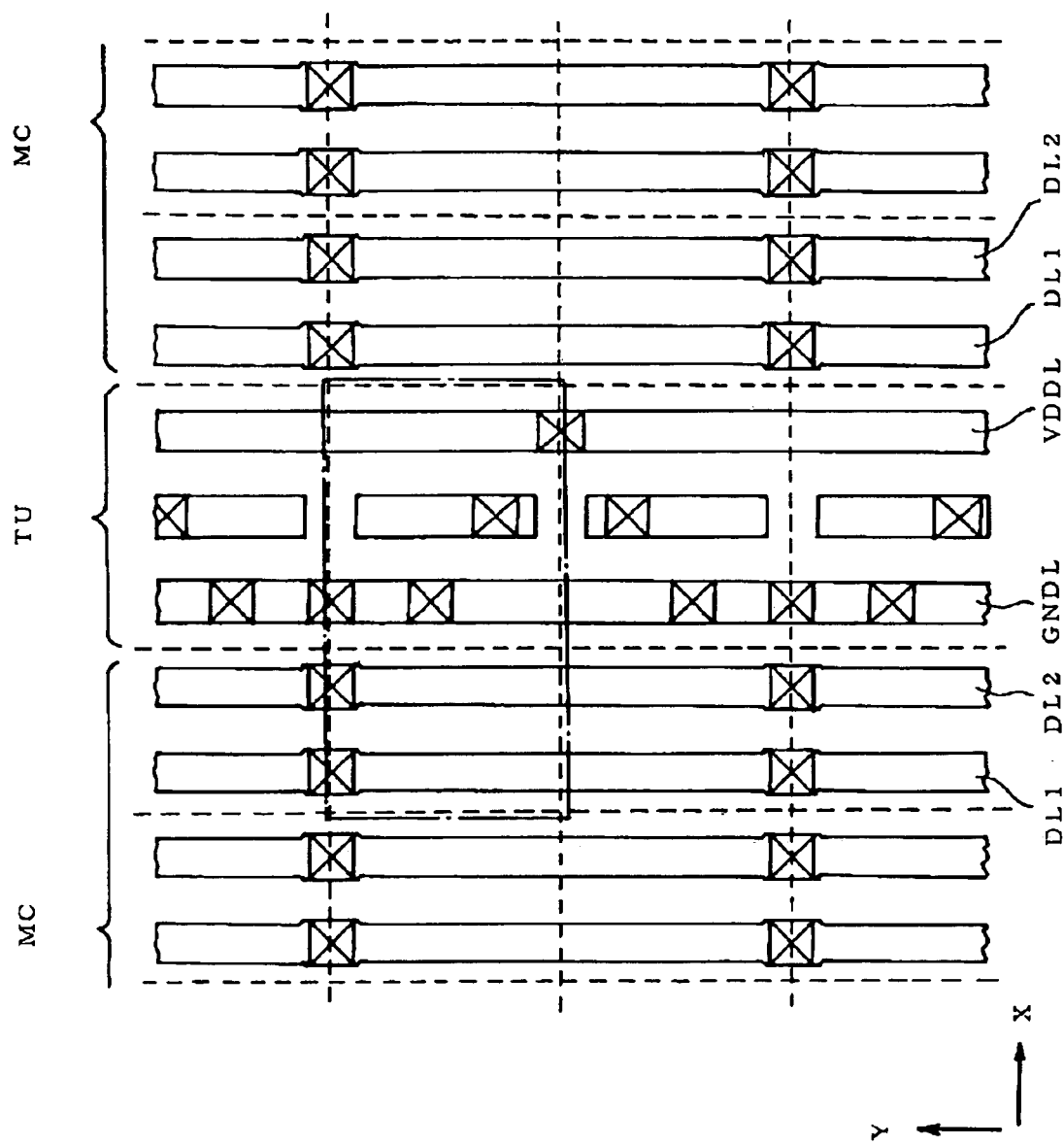
FIG. 2 is a schematic diagram of a layout of a SRAM according to the embodiment.

FIG. 2 is a schematic diagram, showing a layout a SRAM according to the present embodiment, the memory cell MC shown FIG. 1 includes a number of memory cells MC, that are arranged along X direction and along Y direction as a matrix shape, shown as sectioned region by broken lines in FIG. 2, and well contact cell TU for coupling each memory cell to a power VDD and the grounding GND are disposed along X direction in every plurality of memory cell units. The digit lines DL1 and DL2 are respectively extended in Y direction as a pair form on each of the memory cells MC, and one power line VDDL and one ground line GNDL extending in Y direction are respectively arranged on the well contact cell TU. Here, concerning the word line WL shown in FIG. 1, though not shown in FIG. 2, the word line WL of polysilicon is extended to x direction in the underlying layer region, and the word line WL of metal conducted to the lower word line WL is extended along the x direction in upper layer region.

Figure 7:
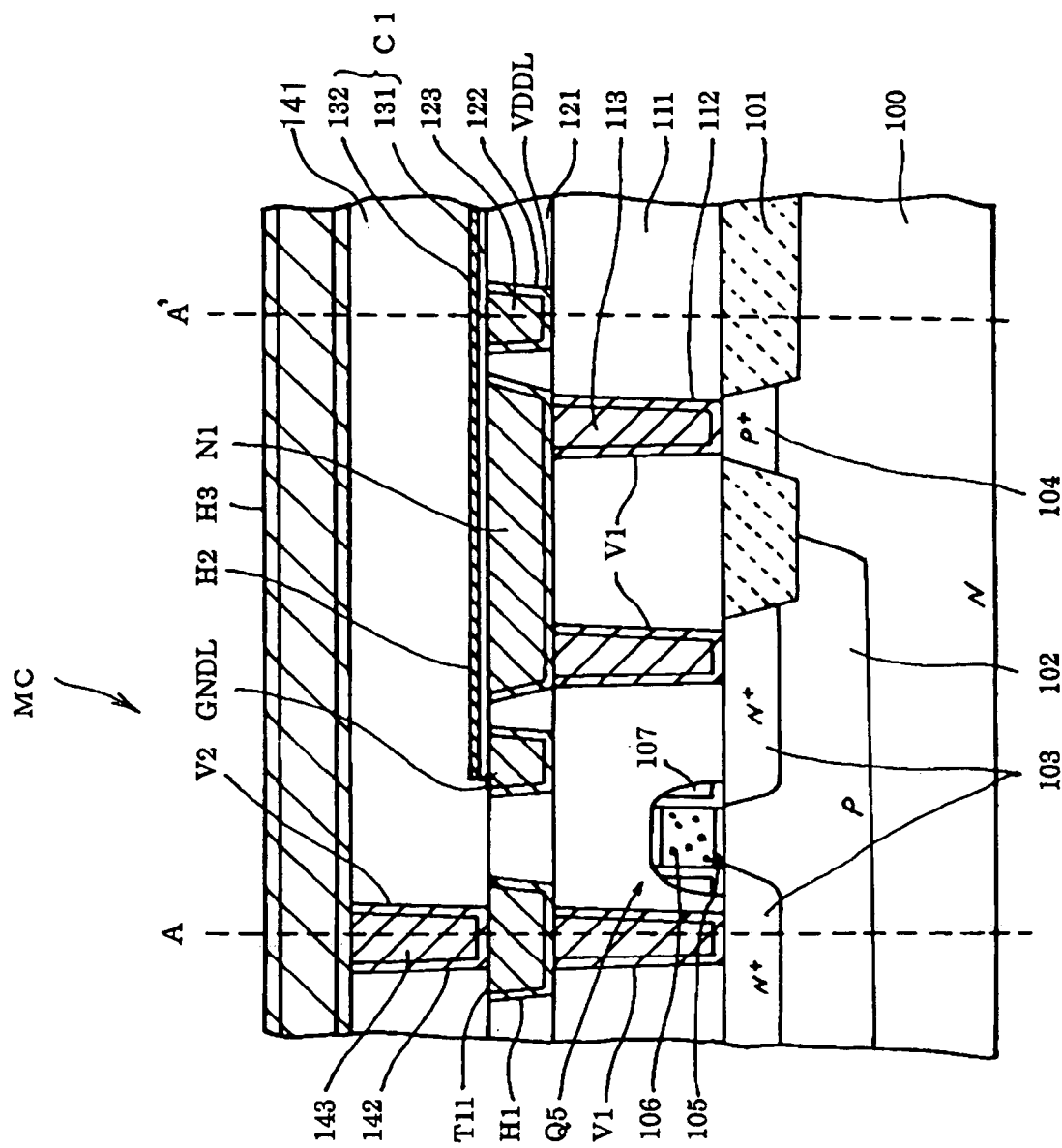
FIG. 7 is a cross-sectional view of the memory cell and the well contact cell shown in FIG. 6 along line A-A'.
Figure 8:
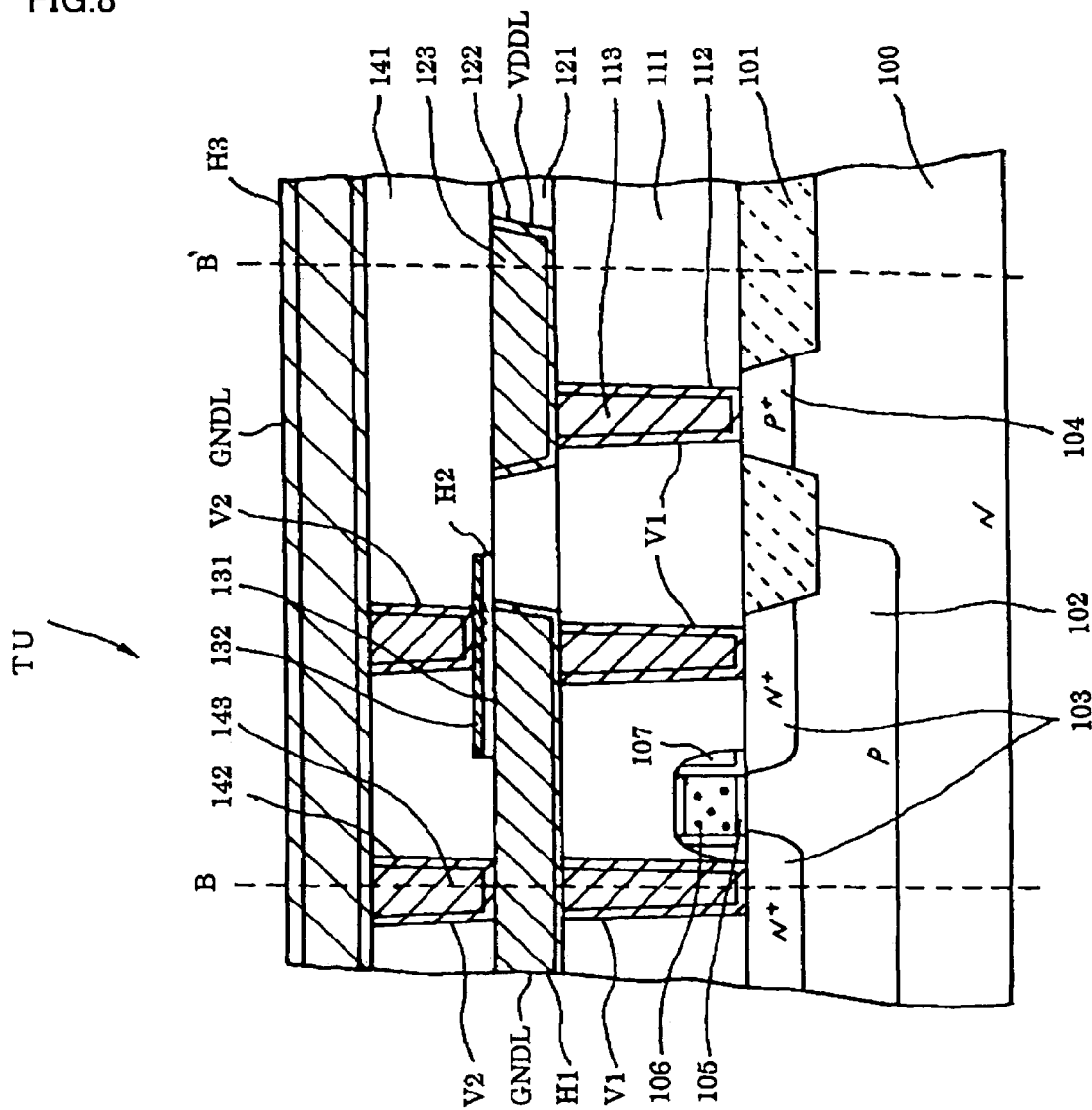
FIG. 8 is a cross-sectional view of the memory cell and the well contact cell shown in FIG. 6 along line B-B'.

In the configuration of the SRAM, one memory cell MC and one well contact cell TU in the region surrounded by alternate long and short dash lines shown in FIG. 2 will be described. FIG. 3 to FIG. 6 respectively show a layout of a diffusion layer and a gate layer, a first interconnect layer, a capacitance electrode layer and a second interconnect layer, and a third interconnect layer in a memory cell MC and a well contact cell TU. In addition, FIG. 7 and FIG. 8 are cross-sectional views along line A-A' and line B-B' of FIG. 6, respectively.

Figure 3:
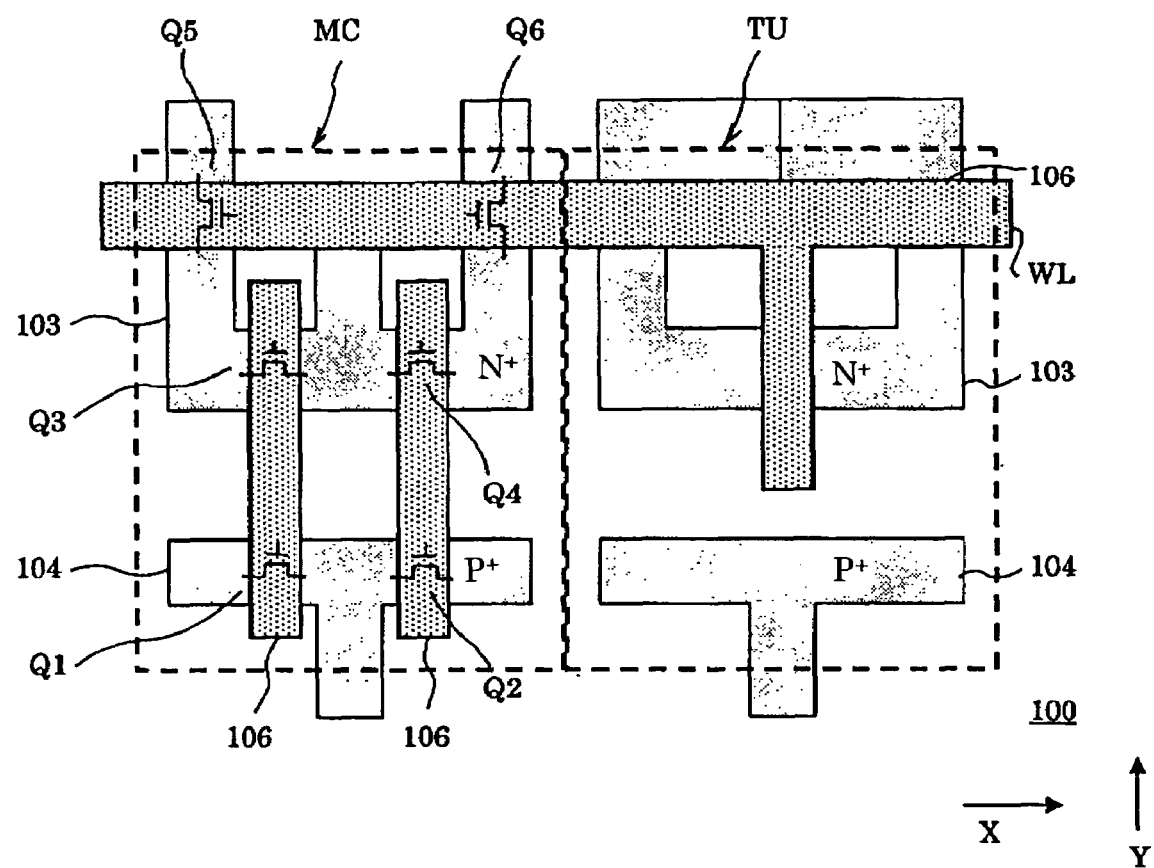
FIG. 3 is a schematic diagram showing a layout of a diffusion layer and a gate electrode of a memory cell and a well contact cell according to the embodiment.

FIG. 3 is a plan view showing the diffusion layer and the gate layer. The transistors Q1 to Q6 are formed of a N-type diffusion layer 103, a P-type diffusion layer 104 and a gate electrode 106 in the memory cell MC. Here, although a part of the gate electrode 106 is formed so as to have an intersection on the N-type diffusion layer 103 in the well contact cell TU, no transistor is formed here. In reference to FIG. 7 and FIG. 8 for the cross-sectional structure of FIG. 3, a field insulating film 101 is formed on the silicon substrate 100, and the N-type diffusion layer 103 and the P-type diffusion layer 104 are formed in the region surrounded by the field insulating film 101. In the present embodiment, a P-type well 102 is formed in a part of the N-type silicon substrate 100, and a N-type diffusion layer 103 is formed in the P-type well 102. A thin silicon oxide film is formed on the surface of silicon substrate 100, and a polysilicon film is formed thereon, and these films are patterned to a predetermined pattern to form a gate insulating film 105 and the gate electrode 106. Although in the present embodiment, sidewalls 107 are formed on both side surfaces of the gate electrode 106 and the MOS transistor is composed as a MOS transistor having lightly doped drain (LDD) structure, the illustration of LDD layer is not shown in these figures, for the purpose of simplifying the illustration here. Having such configuration, six transistors Q1 to Q6, each composed of a diffusion layer and a gate electrode, are formed in the memory cell MC. In addition, gate electrodes of the transfer transistors Q5 and Q6 are extended along X direction, and composed as the word lines WL. These word lines WL are extended so as to cross over the well contact cell along X direction.

Figure 4:
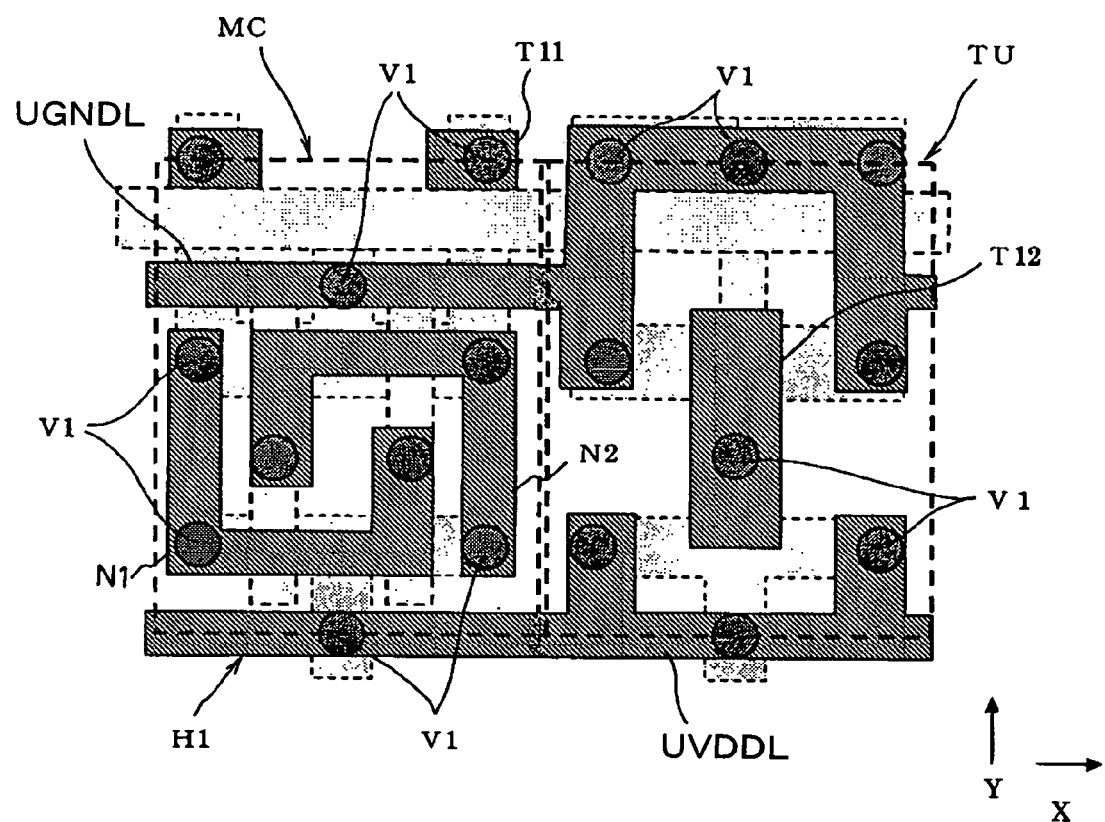
FIG. 4 is a schematic diagram showing a layout of the first interconnect layer of the memory cell and the well contact cell according to the embodiment.

FIG. 4 is a plan view, showing the first interconnect layer. The first vias V1 connected to the transistors Q1 to Q6 are formed on multiple locations, and the first interconnect layer H1 coupled to the first vias V1 are formed to have a predetermined pattern. More specifically, in reference to FIG. 7 and FIG. 8 for the cross-sectional structure of FIG. 4, a first interlayer dielectric layer 111 is formed over the entire surface of the gate electrode 106 shown in FIG. 3, and respective diffusion layers 103 and 104 and a plurality of first vias V1, which connect to gate electrode at the well contact cell TU, are formed in the first interlayer dielectric layer 111. The first vias V1 are formed by: forming a barrier metal film 112 of titanium nitride (TiN) or the like in a through hole opened in the first interlayer dielectric layer 111; filling the internal thereof with a interconnect metal 113 of W (tungsten) or the like; and planarizing the surface thereof via a chemical mechanical polishing (CMP), so that the polished surface is coplanar to the first interlayer dielectric layer 111. Further, the second interlayer dielectric layer 121 is formed thereon, and the first interconnect layer H1 shown in FIG. 4 is formed in the second interlayer dielectric layer 121.

The first interconnect layer H1 is formed as so-called buried or embedded interconnect, and is formed by: forming a trench having a predetermined pattern in the second interlayer dielectric layer 121 across the almost entire thickness; forming a barrier metal film 122 of TiN and the like in the trench; filling the interior thereof with the interconnect metal 123 of W and the like; and planarizing the surface thereof via CMP, so that the polished surface is coplanar to the second interlayer dielectric layer 121. More specifically, the first interconnect layer H1 (lower capacitance electrode) is an embedded interconnect that is embedded in the trench formed in the second interlayer dielectric layer 121, and the upper surface thereof is formed so as to be substantially coplanar to the upper surface of the second interlayer dielectric layer 121. Therefore, the upper surface of the first interconnect layer H1 is not protruded from the upper surface of the second interlayer dielectric layer 121. In addition, the first interconnect layer H1 has a same thickness that the second interlayer dielectric layer 121 has.

In reference back to FIG. 4 again, the first interconnect layer H1 is partially formed as node interconnects N1 and N2 for mutually coupling sources, drains and gates of respective transistors Q1 to Q6 in the memory cell MC. More specifically, it is formed as the first node interconnect N1 for respectively coupling the source of the load transistor Q1, the source of the driving transistor Q3 (Q1 and Q3 form an inverter) and the source of the transfer transistor Q5 to the gate of the driving transistor Q4, and the second node interconnect N2 for respectively coupling the source of load transistor Q2, the source of driving transistor Q4 (Q2 and Q4 form another inverter) and the source of transfer transistor Q6 to the gate of driving transistor Q3. In addition, one of other parts of the first interconnect layer H1 us composed as an underlying layer power line UVDDL and an underlying layer ground line UGNDL. Further, yet other part of the first interconnect layer H1 is composed of as a relay electrode T11 for electrically coupling to the digit lines DL1 and DL2 that are formed on the top layer thereof, as mentioned later.

On the other hand, as shown in FIG. 4, in the well contact cell TU, the underlying layer power line UVDDL and the underlying layer ground line UGNDL extended from the memory cell MC is disposed in the first interconnect layer H1, and other part thereof is configured as the relay electrode T12 for electrically coupling to a metal word line MWL of the other upper layer, which are not shown in FIG. 4.

Figure 5:
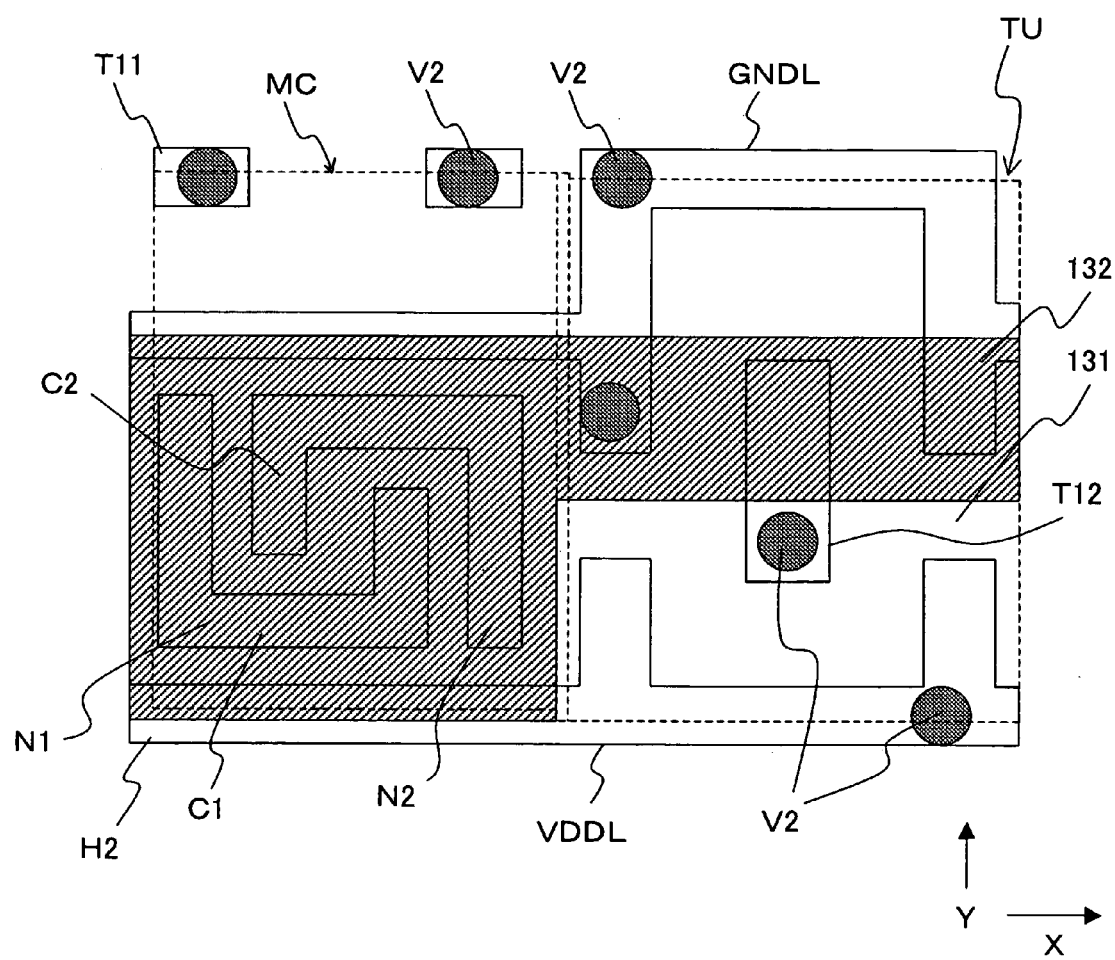
FIG. 5 is a schematic diagram showing layout of capacitance electrode layers of the memory cell and the well contact cell according to the embodiment.

FIG. 5 is a plan view showing the second interconnect layer. In reference to FIG. 7 and FIG. 8 for the cross-sectional structure of FIG. 5, thinner and substantially flat capacitance insulating film 131 is formed on the surface of the second interlayer dielectric layer 121 and on the surface of the first interconnect layer H1 utilized as the embedded interconnect, and an upper capacitance electrode 132 composed of substantially flat second interconnect layer H2 having thinner film thickness is formed thereon. That is, the first capacitance insulating film 131 is substantially flatly formed so as to contact the upper surface of the second interlayer dielectric layer 121 that contains the interconnect layer H1. In addition, the upper capacitance electrode 132 is substantially flatly formed so as to contact the upper surface of the capacitance insulating film 131. Here, "substantially flatly" means that the flatness of the capacitance insulating film 131 and the upper capacitance electrode 132 is within a range for exhibiting the advantageous effect according to the present embodiment. In the memory cell MC, the second interconnect layer H2, and consequently the upper capacitance electrode 132 is formed so as to cover the almost entire region of memory cell MC except the region where relay interconnect T11 exists. In other words, the upper capacitance electrode 132 is formed across the entire region except the region for electrically coupling to the upper layer interconnect. In the well contact cell TU, the upper capacitance electrode 132 is formed in a region where no interference with the second vias V2, which leads to the power line VDDL of the top layer thereof, is occurred as mentioned later. In a region where the first interconnect layer H1 (lower capacitance electrode), the capacitance insulating film 131 and the second interconnect layer H2 (upper capacitance electrode 132) are overlapping along the thickness direction, the capacitors C1 and C2 are composed of these layers. More specifically, a portion of the first interconnect layer H1 formed as the node interconnects N1 and N2 is configured as the lower capacitance electrode, and the capacitors C1 and C2 are composed of the capacitance insulating film 131 provided thereon and the upper capacitance electrode 132 stacked thereon along the thickness direction, and these capacitors C1 and C2 are coupled to both of the node interconnects N1 and N2 of the SRAM shown in FIG. 1. In other words, the upper capacitance electrode 132 is formed in a region covering the node interconnects N1 and N2.

In reference back to FIG. 5 again, the second vias V2 are formed on the second interconnect layer H2. The second vias V2 are disposed in a position over the relay electrode T11 in the memory cell MC, and are disposed respectively over the relay electrode T12, over the power line VDDL, over the ground line GNDL, and over the upper capacitance electrode 132, in the well contact cell TU. As shown in FIG. 7 and FIG. 8, a third interlayer dielectric layer 141 is formed on the second interconnect layer H2, and the second vias V2 are formed in the third interlayer dielectric layer 141. The second vias V2 are formed by: forming a barrier metal film 142 of TiN or the like in a through hole opened in the third interlayer dielectric layer 141; filling the internal thereof with an interconnect metal 143 of W or the like; and planarizing the surface thereof so as to be coplanar with the surface of the third interlayer dielectric layer 141.

Figure 6:
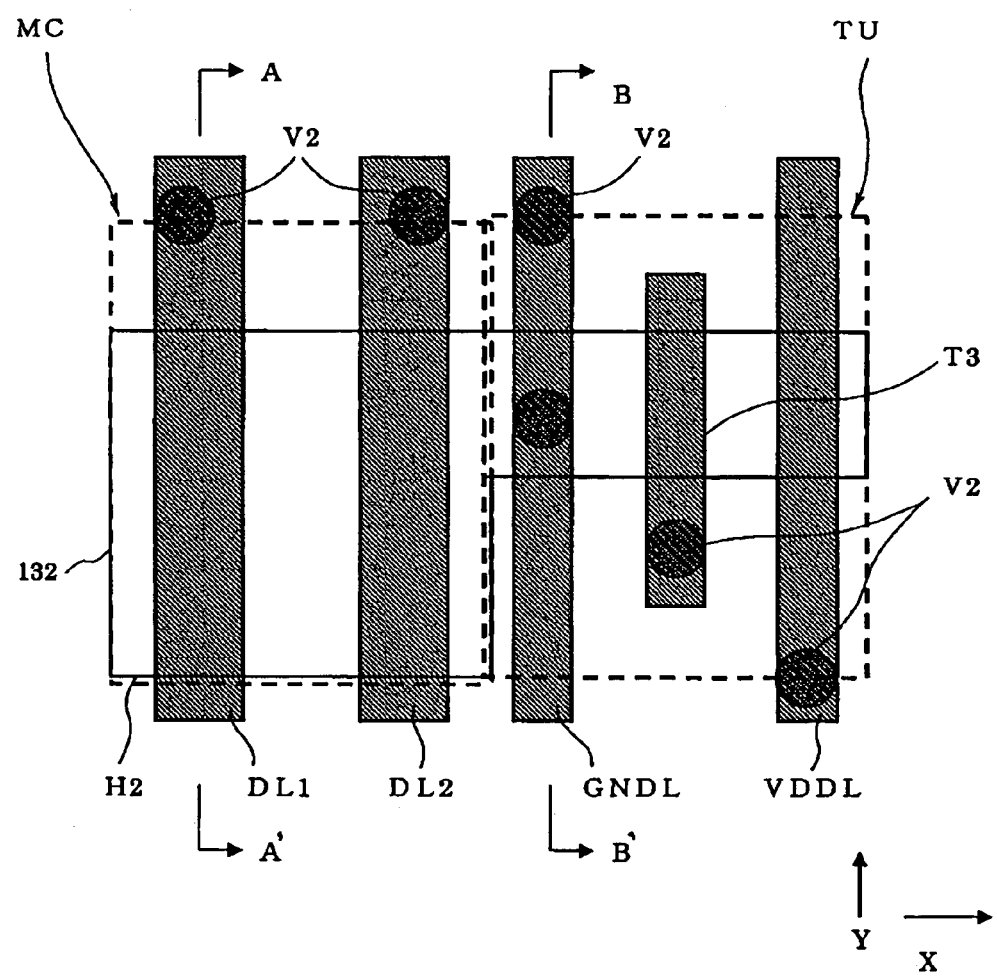
FIG. 6 is a schematic diagram showing a layout of the second interconnect layer of the memory cell and the well contact cell according to the embodiment.

FIG. 6 is a plan view showing the third interconnect layer. Concerning the third interconnect layer H3, the digit lines DL1 and DL2 are formed in the memory cell MC. In the well contact cell TU, a power line VDDL, a ground line GNDL and a relay electrode T3 coupled to a metal word line MWL of the upper layer and not shown in the drawings, are formed. These interconnect layers are electrically coupled to the underlying interconnects through the second vias V2, respectively, and the digit lines DL1 and DL2 are coupled to respective drains of the transfer transistors Q5 and Q6 through the second via V2, the relay electrode T11 and the first vias V1 in the memory cell MC. More specifically, in reference to FIG. 7 and FIG. 8 for the cross-sectional structure of FIG. 6, the third interconnect layer H3 having a multilayer structure of TiN/

Al(aluminium)/TiN is formed on the surface of the third interlayer dielectric layer 141 to have a predetermined pattern. The power line VDDL is coupled to respective sources of the load transistors Q1 and Q2 through the second vias V2, underlying layer power line UVDDL and the first vias V1. The ground line GNDL is coupled through the second vias V2 to the upper capacitance electrode 132, or is coupled to the respective sources of the driving transistors Q3 and Q4 through the second vias V2, the underlying layer ground line UGNDL and the first vias V1. Here, the first interconnect layer H1 composes a plurality of the lower capacitance electrodes. Therefore, a plurality of capacitors (for example, capacitor C1, capacitor C2) is composed of the first interconnect layer H1, the capacitance insulating film 131 and the upper capacitance electrode 132 The relay electrode T3 of the third interconnect layer H3 is coupled to the word line WL through the second vias V2, the relay electrode T11 and the first vias V1, and the word line WL is coupled to the metal word line MWL of the upper layer to promote reducing the resistance thereof.

Advantageous effects provided by having the configurations according to the present embodiment will be described as follows.

In the SRAM having the above-mentioned configuration, the capacitors C1 and C2 are composed of: the first interconnect layer H1 as lower capacitance electrode forming node interconnects N1 and N2; the capacitance insulating film 131 overlapped directly thereon; and the upper capacitance electrode 132 composed of the second interconnect layer H2. In addition, since the upper capacitance electrode 132 is coupled to the ground line GNDL, the configuration is that the capacitors C1 and C2 are coupled in parallel to the node interconnects N1 and N2, which are, in turn, coupled to respective sources of both driving transistors Q3 and Q4. Therefore, even if the cell size of the SRAM is reduced, and the line width is reduced, the node capacitances at both of the node interconnects N1 and N2 of the SRAM are increased by additional capacitances of the added capacitors, and, in turn, data stored charge is increased to improve the soft-error resistance for a ray or the like. In addition, it is not necessary to form pair of the node interconnects N1 and N2 as dual layers described as the technology disclosed in Japanese Patent Laid-Open No. H10-163,440, and the node interconnects N1 and N2 can be composed of with monolayer, and thus a necessity for the complicated process for manufacturing the node interconnects can be avoided.

On the other hand, the first interconnect layer H1 composing the lower capacitance electrodes of capacitors C1 and C2 are formed of embedded interconnects formed in the second interlayer dielectric layer 121, and moreover, the surface of the first interconnect layer H1 is substantially flatly formed so as to be coplanar to the surface of the second interlayer dielectric layer 121. In addition, the first interconnect layer H1 has a same thickness that the second interlayer dielectric layer 121 has. Therefore, the capacitance insulating film 131 formed thereon and the upper capacitance electrode 132 of the second interconnect layer H2 can be substantially flatly formed, and the capacitor having improved reliability can be obtained without causing problems such as defects in the step portion and the like as described in Japanese Patent Laid-Open No. 2002-324,855 when thinner film thickness of the capacitance insulating film 131 and the upper capacitance electrode 132 is formed, and further reduction of the film thickness of the capacitance insulating film 131 can be achieved, thereby providing an advantageous effect in increasing the capacitance.

Further, by forming thinner capacitance insulating film 131 and thinner upper capacitance electrode 132, almost no influence on a flatness of the surface of the third interlayer dielectric layer 141 formed thereon can be achieved, and the flatness of the third upper layer interconnect layer H3 formed thereon can also be ensured, thereby allowing to form the interconnect layer with improved reliability, even if the line width of the third interconnect layer H3 is reduced. In the present embodiment, the film thickness of the capacitance insulating film 131 may be 10 to 20 nm, the film thickness of upper capacitance electrode 132 may be 10 to 2500 nm, preferably 10 to 200 nm, and the step height of the third interconnect layer H3 against the surface of the third interlayer dielectric layer 121 can be decreased to approximately zero, thereby providing more improvement in the flatness thereof.

While the present invention has been described in reference to the preferred embodiments, it is apparent to those skilled in the art that the disclosures contained herein are for the purposes of illustrating the present invention only, and other configurations of the structures or processes may be suitably employed without departing from the scope and spirits of the invention.

Figure 9:
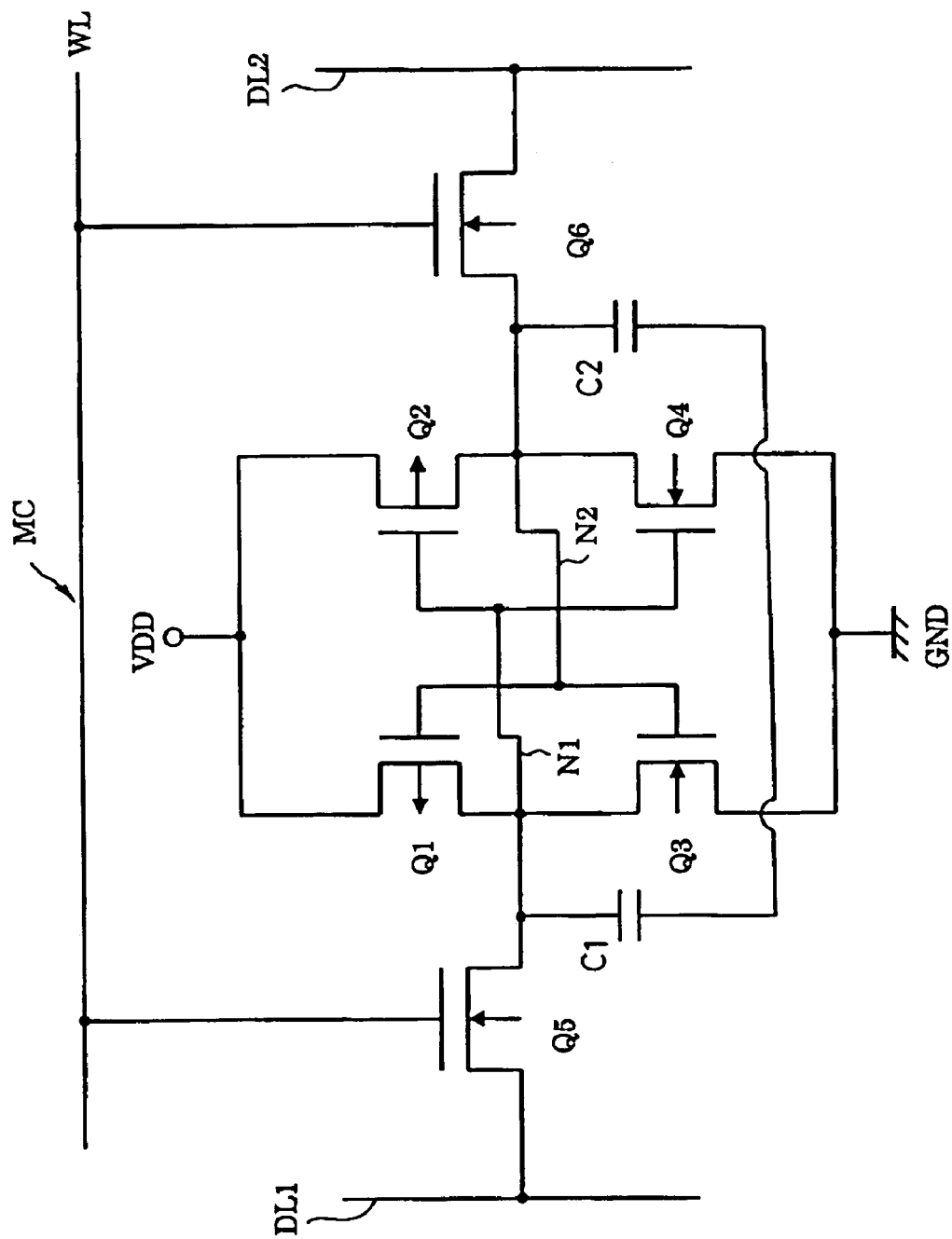
FIG. 9 is an equivalent circuit schematic of a SRAM according to the embodiment.
Figure 10:
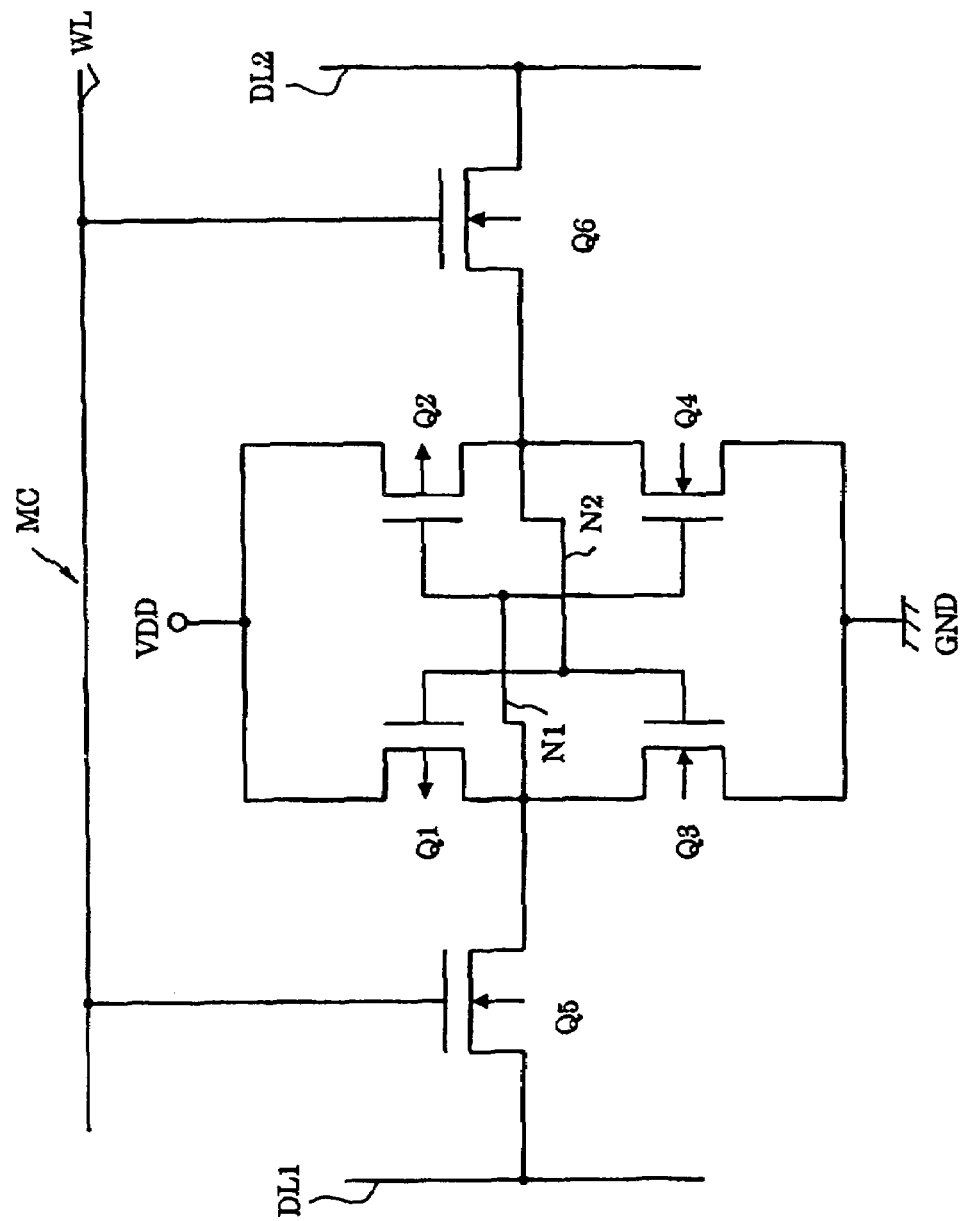
FIG. 10 is an equivalent circuit schematic of a SRAM according to prior art.

For example, while the example of grounding the capacitors C1 and C2 of the upper capacitance electrode 132 is illustrated in the above-described embodiment, a circuit structure having the upper capacitance electrode 132 being at a floating potential may be employed, as shown in FIG. 9. The upper capacitance electrode 132 can be at a floating potential by removing a portion of the second vias V2 that couple the ground line GNDL and the upper capacitance electrode 132 from the second vias V2 shown in FIG. 5 and FIG. 6 in the well contact cell TU. Otherwise it can be achieved by forming no upper electrode interconnect 132 in the well contact cell TU. In case of the present embodiment, since each of the upper capacitance electrodes 132 of the capacitors C1 and C2 are common, the two capacitors C1 and C2 are coupled between the node interconnects N1 and N2 in series. Having such configuration, an advantageous effect of reducing the additional capacitance value can be obtained.

In addition, while the above-described embodiments illustrate examples of applying the capacitor of the SRAM, it is not intended to limit the scope of the invention to the SRAM, provided that it is useful for the capacitor of semiconductor integrated circuit device.

It is apparent that the present invention is not limited to the above embodiment, that may be modified and changed without departing from the scope and spirit of the invention.

What is claimed is:

1. A semiconductor integrated circuit device, comprising:
a semiconductor substrate; and
a capacitor forming at least part of a memory cell and including a multi-layer structure comprising:
  a lower capacitance electrode;
  a capacitance insulating film;
  an upper capacitance electrode, all of which are deposited in this order, said capacitor being disposed on said semiconductor; and
a well contact cell coupled to said memory cell,
wherein said lower capacitance electrode comprises a node interconnect of said memory cell embedded in a trench formed in an interlayer dielectric layer provided on said semiconductor substrate, and an upper surface thereof is formed to be substantially coplanar to an upper surface of said interlayer dielectric layer, wherein said capacitance insulating film is substantially flatly formed so as to contact the upper surface of said interlayer dielectric layer containing said lower capacitance electrode, wherein said upper capacitance electrode is substantially flatly formed so as to contact an upper surface of said capacitance insulating film and across an entire region of said memory cell except a region thereof for providing an electric coupling to an upper layer interconnect, and wherein said upper capacitance electrode is extended into a partial region of said well contact cell.

2. The semiconductor integrated circuit device according to claim 1,
wherein said lower capacitance electrode comprises a node interconnect embedded in said interlayer dielectric layer that electrically interconnects at least two circuit elements.

3. The semiconductor integrated circuit device according to claim 2,
wherein said interconnect includes a plurality of said lower capacitance electrodes,
wherein a plurality of said capacitance insulating films are provided on said plurality of lower capacitance electrodes,
wherein upper capacitance electrodes are independently provided respectively on the capacitance insulating films, and
wherein a plurality of capacitors comprise said interconnect, said capacitance insulating films and said upper capacitance electrodes.

4. The semiconductor integrated circuit device according to claim 1,
wherein said lower capacitance electrode comprises at least a part of an interconnect coupled to a circuit element formed on a layer underlying said interlayer dielectric layer, and has a structure adding an electrostatic capacity of said capacitor to the interconnect of said circuit element.

5. The semiconductor integrated circuit device according to claim 4,
wherein said circuit element comprises a transistor forming at least part of said memory cell, and
wherein said lower capacitance electrode comprises the interconnect of the memory cell.

6. The semiconductor integrated circuit device according to claim 5,
wherein said memory cell comprises an SRAM,
wherein the SRAM comprises a pair of driving transistors, which cross-couples at least a gate and a drain via a pair of node interconnects,
wherein said capacitor comprises a pair of capacitors respectively coupled to said pair of node interconnects, and
wherein said lower capacitance electrode of said capacitor comprises each of said node interconnects.

7. The semiconductor integrated circuit device according to claim 6,
wherein said SRAM comprises an SRAM having a six-transistor configuration, said six transistor-configuration comprises:
a pair of transfer transistors that are disposed respectively between said pair of node interconnects and the pair of digit lines to couple thereof; and
a pair of load transistors that are respectively coupled to said pair of driving transistors.

8. The semiconductor integrated circuit device according to claim 6,
wherein said upper capacitance electrode is formed within a region covering said node interconnect.

9. The semiconductor integrated circuit device according to claim 6,
wherein said SRAM has a configuration, in which at least one memory cell and a well contact cell for providing an electrical coupling of said memory cell to a power line and a ground line of the upper layer are arranged, and
wherein said upper capacitance electrode is extended into a partial region of said well contact cell and is electrically coupled to said power line or said ground line in said partial region.

10. The semiconductor integrated circuit device according to claim 6,
wherein each of said upper capacitance electrodes of said pair of capacitors is fixed at a ground potential.

11. The semiconductor integrated circuit device according to claim 6,
wherein said respective upper capacitance electrodes of said pair of capacitors are mutually coupled and have a floating potential.

12. The semiconductor integrated circuit device according to claim 1,
wherein said upper layer interconnect comprises a digit line.

13. The semiconductor integrated circuit device according to claim 1,
wherein said upper capacitance electrode has a thickness of approximately 10 to 200 nm.

14. The semiconductor integrated circuit device according to claim 1,
wherein each of a first interconnect layer, a second interconnect layer and a third interconnect layer is consecutively disposed to form a multilayer on a transistor forming at least part of said memory cell,
wherein said node interconnect, a power line and a ground line are provided in said first interconnect layer,
wherein said upper capacitance electrode is provided in said second interconnect layer,
wherein a digit line as said upper layer interconnect is provided in said third interconnect layer, and
wherein said semiconductor integrated circuit comprises a first word line provided in said first interconnect layer and a second word line provided in said third interconnect layer, and said first word line and said second word line are electrically coupled.

15. The semiconductor integrated circuit device according to claim 1, wherein said capacitance insulating film and said upper capacitance electrode cover substantially the same area.

16. The semiconductor integrated circuit device according to claim 1, wherein a film thickness of said capacitance insulating film is 10 to 20 nm.

17. The semiconductor integrated circuit device according to claim 1, wherein said capacitance insulating film covers a plurality of lower capacitance electrodes.

18. A semiconductor integrated circuit device, comprising:
a lower capacitance electrode, comprising a node interconnect embedded in a trench formed in an interlayer dielectric layer provided on a semiconductor substrate, a surface of said lower capacitance electrode being formed to be substantially coplanar to a surface of said interlayer dielectric layer; and
a capacitor, forming at least part of a memory, including:
a capacitance insulating film, being flatly formed on a surface of said interlayer dielectric layer containing said lower capacitance electrode; and an upper capacitance electrode, being flatly formed on said capacitance insulating film, wherein said memory comprises at least one memory cell and a well contact cell for providing an electrical coupling of said memory cell, and wherein said upper capacitance electrode is extended into a partial region of said well contact cell.

19. A semiconductor integrated circuit device, comprising:
a semiconductor substrate;
a capacitor forming at least part of a memory cell and including a multi-layer structure comprising:
  a lower capacitance electrode;
  a capacitance insulating film; and
  an upper capacitance electrode, all of which are deposited in this order, said capacitor being disposed on said semiconductor substrate; and
a well contact cell coupled to said memory cell,
wherein said lower capacitance electrode comprises a node interconnect of said memory cell embedded in a trench formed in an interlayer dielectric layer provided on said semiconductor substrate, and said lower capacitance electrode has a same thickness that said interlayer dielectric layer has,
wherein said upper capacitance electrode is formed across an entire region of said memory cell except a region thereof for providing an electric coupling to an upper layer interconnect, and
wherein said upper capacitance electrode is extended into a partial region of said well contact cell.

20. A semiconductor integrated circuit device, comprising:
a first inverter having a first input and a first output;
a second inverter having a second input which is connected to said first output through a first node interconnect and a second output which is connected to said first input through a second node interconnect;
a first capacitor and a second capacitor which are connected to said first node interconnect and said second node interconnect, respectively; and
a well contact cell coupled to said first and second inverters,
wherein said first and second capacitors comprise a lower capacitance electrode, a capacitance insulating film, and an upper capacitance electrode,
wherein said lower capacitance electrode comprises said first and second node interconnects embedded in a trench formed in an interlayer dielectric layer provided on a semiconductor substrate, and an upper surface of said lower capacitance electrode is formed to be substantially coplanar to an upper surface of said interlayer dielectric layer,
wherein said capacitance insulating film is substantially flatly formed so as to contact the upper surface of said interlayer dielectric layer containing said lower capacitance electrode,
wherein said upper capacitance electrode is substantially flatly formed so as to contact an upper surface of said capacitance insulating film, and across an entire region of said first inverter and said second inverter except a region for providing an electric coupling to an upper layer interconnect, and
wherein said upper capacitance electrode is extended into a partial reason of said well contact cell.

* * * * *